US006642556B2

(12) United States Patent
Ulrey

(10) Patent No.: US 6,642,556 B2
(45) Date of Patent: Nov. 4, 2003

(54) MODULAR MACRO CELL LAYOUT METHOD

(75) Inventor: Renard Ulrey, Fort Collins, CO (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 10/128,610

(22) Filed: Apr. 22, 2002

(65) Prior Publication Data

US 2003/0089927 A1 May 15, 2003

Related U.S. Application Data

(60) Provisional application No. 60/332,301, filed on Nov. 9, 2001.

(51) Int. Cl.[7] ............................................. H01L 27/10
(52) U.S. Cl. ............................ 257/208; 716/12; 716/14
(58) Field of Search ........................... 257/208; 716/12, 716/14

(56) References Cited

U.S. PATENT DOCUMENTS

| 5,825,203 A | * | 10/1998 | Kusunoki et al. ............. 326/41 |
| 6,097,073 A | * | 8/2000 | Rostoker et al. ............ 257/401 |
| 2002/0064064 A1 | * | 5/2002 | Yamada et al. ............... 365/63 |

* cited by examiner

Primary Examiner—David Nelms
Assistant Examiner—Tu-Tu Ho
(74) Attorney, Agent, or Firm—Paul M. Thomson; William W. Cochran

(57) ABSTRACT

The present invention provides a method and apparatus for managing a large number of associated interconnects within an integrated circuit involving a modular approach to the macro cell layout. In a circumstance where a macro can be employed for multiple instantiations, and wherein such a design unique signals must be distributed to each instantiation, certain commonalities may exist which can be exploited to achieve a simple yet elegant approach facilitating the routing of these unique signal paths and premapping standardized contact points.

27 Claims, 5 Drawing Sheets

MODULAR MACRO CELL LAYOUT METHOD

CROSS-REFERENCE TO RELATED APPLICATIONS

This application claims the benefit from U.S. Provisional Application Serial No. 60/332,301 filed Nov. 9, 2001 entitled "Macro Cell Layout Method Allowing Unrestricted Adjacency Placement and Unique Signal Distribution from a Signal Supply Bus" by Renard Ulrey, which is specifically incorporated herein by reference for all that it discloses and teaches.

FIELD OF THE INVENTION

The present invention generally relates to semiconductors and more specifically to signal routing within integrated circuit design.

BACKGROUND OF THE INVENTION

The layout for large-scale integrated microchips is one of the most time consuming tasks in the design cycle for an integrated circuit (IC). The input to this layout is a partitioned circuit, i.e., elementary components of the circuit are grouped to build a number of macro cells (modules). On the borders of these cells, signal trace endpoints or terminals are located to provide signal paths between circuit blocks of the IC and connection layers such as metal or polysilicon layers. These connection layers, also known as interconnects, require some finite width and thickness to ensure reliability of the interconnect and signal integrity.

The output of this design process is a layout for the integrated circuit. The layout describes the placement of the macro cells and the routes for the interconnects between the macro cells. One objective in layout optimization may be to find an arrangement that minimizes overall area. Cells are not allowed to overlap each other, and the routing has to meet specific technical constraints, i.e., space between parallel wires has to be added to prevent short circuits and transmission effects, and for some critical traces the delay has to stay below a given threshold, which results in maximal admissible wire lengths for these traces.

Many methods to manage a large number of associated interconnects when laying out an IC have been attempted. A common method for routing unique signals to individual macros involves a design with signal connection point(s) defined within the macro itself (hard macros). These signal connection points are manually (or via a software routing tool) creating the signal bus that connects the signal sources to the corresponding connection points. For this method, it is assumed that a routing channel is left within or above the macro during the course of the macro design.

When numerous signal paths are required between circuit blocks, the routing congestion caused by placement of the associated interconnects will increase the overall size of the IC and thus increase the cost of the product. That congestion has an increased effect when the area between the circuit blocks is limited. A further problem arises when numerous tightly spaced functional blocks require a high number of signal paths between these blocks. The associated numerous interconnects will cause even more IC area congestion that will further increase the IC size and associated cost.

SUMMARY OF THE INVENTION

The present invention overcomes the disadvantages and limitations of the prior art by providing a method and apparatus to reduce or eliminate the need to connect individual macro cell signals with traces that are supplemental to the macro cell layout. This method and apparatus to manage a large number of associated interconnects when laying out an integrated circuit involves taking a modular approach to macro cell layout. In circumstances where a macro can be employed for multiple instantiations, and where such design signals must be distributed to each instantiation, certain commonalities may exist which can be exploited to achieve a simple yet elegant approach facilitating the routing of these unique signal paths. This invention facilitates routing these unique signal paths with minimal cost and space while significantly reducing the design effort. The routing can be performed by establishing a modular "library" of macros and then physically placing these macros adjacent to one another so that the signal connections are made to the adjacent macros.

The present invention may, therefore, comprise a method of laying out internal signal paths in integrated circuit macro cells that minimizes the need for external signal paths comprising; placing a first macro cell with input and output premapped interconnect locations such that the internal signal paths that propagate through the first macro cell reach an outgoing edge of the first macro cell at standard output premapped interconnect locations; placing a second macro cell adjacent to the first macro cell such that the standard output premapped interconnect locations of the first macro cell physically align with input premapped interconnect locations of the second macro cell.

The present invention may also comprise an integrated circuit macro cell having a standard signal interconnect layout for connecting to additional macro cells comprising; a standardized configuration of input premapped interconnect locations for receiving signals from signal paths of the additional macro cells at an incoming edge of the macro cell; signal paths propagated through the macro cell that reach an outgoing edge of the macro cell at standard output premapped interconnect locations such that the output premapped interconnect locations of the macro cell physically align with the input premapped interconnect locations of the additional macro cells.

The present invention may also comprise an integrated circuit with macro cells placed adjacent to one another comprising; a first macro cell having standard input premapped interconnect locations such that the internal signal paths that propagate through the first macro cell reach an outgoing edge of the first macro cell at standard output premapped interconnect locations; a second macro cell that is placed adjacent to the first macro cell such that the standard output premapped interconnect locations of the first macro cell physically align with input premapped interconnect locations of the second macro cell.

IC designs that are capable of exploiting these types of macro layout designs are advantageous over current designs because they require less signal routing, and therefore, less design time and effort, a reduction in circuit area and overall wire trace length. In addition, other technical constraints such as short circuits, transmission effects, and signal delays can be addressed directly within the macro design.

Numerous advantages and features of the present invention will become readily apparent from the following detailed description of the invention and the embodiment thereof, from the claims and from the accompanying drawings in which details of the invention are fully and completely disclosed as a part of this specification.

DETAILED DESCRIPTION OF THE INVENTION

Figure 1:
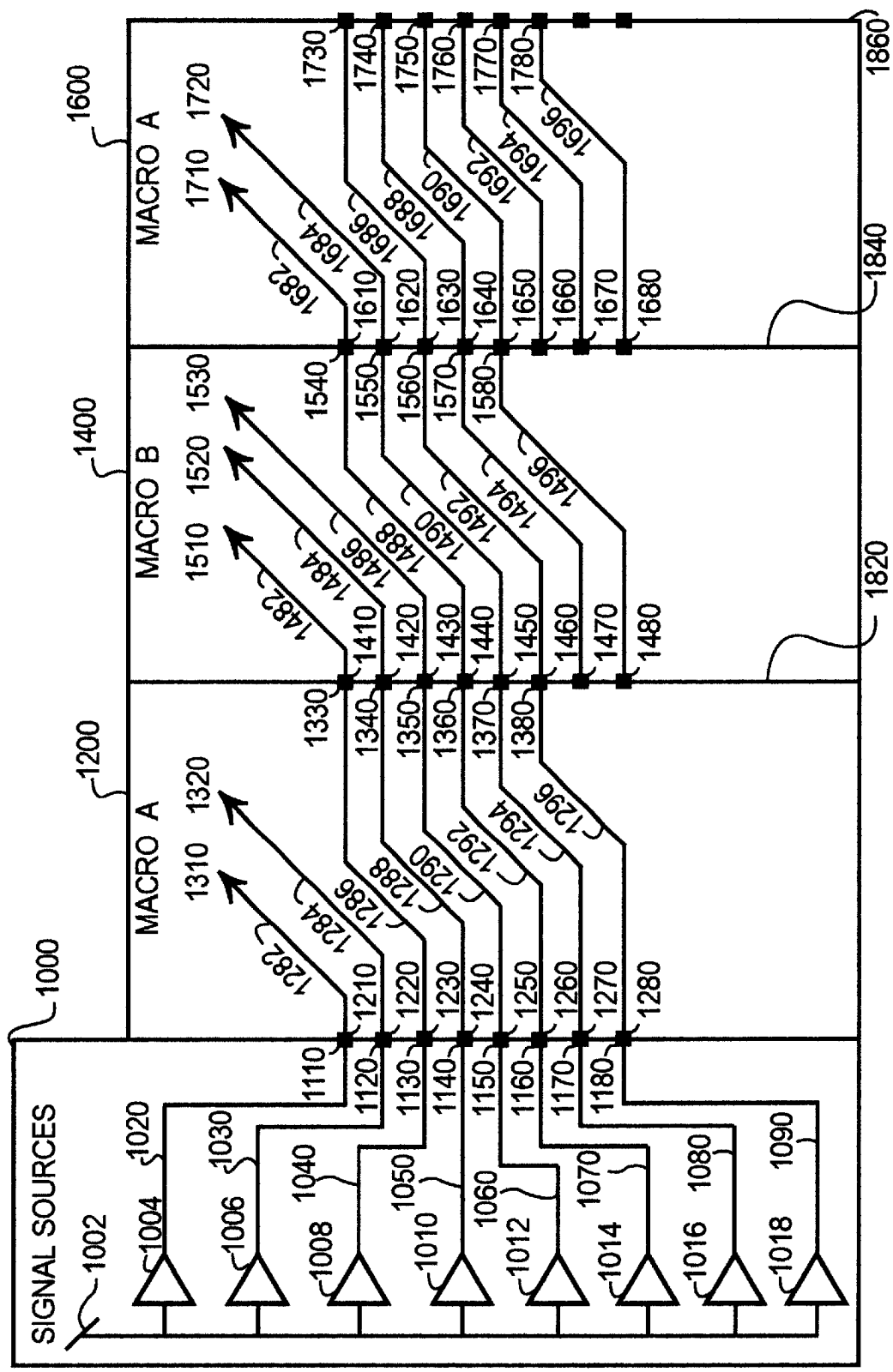
FIG. 1 is a schematic diagram of a typical macro cell layout with successive macro cells placed on an opposing edge with respect to said input premapped interconnects of the previous macro cell.

While this invention is susceptible to embodiment in many different forms, there is shown in the drawings, and will be described herein in detail, specific embodiments thereof with the understanding that the present disclosure is to be considered as an exemplification of the principles of the invention and is not to be limited to the specific embodiments described.

The present invention provides a method and apparatus for managing a large number of associated interconnects within an integrated circuit involving a modular approach to the macro cell layout. In a circumstance where a macro can be employed for multiple instantiations; and wherein such a design unique signals must be distributed to each instantiation, certain commonalities may exist which can be exploited to achieve a simple yet elegant approach facilitating the routing of these unique signal paths and premapping standardized contact points.

FIG. 1 shows a top-level schematic diagram of the method of the present invention for a typical macro cell layout with successive macro cells placed on an opposing edge with respect to the input premapped interconnects of the previous macro cell. A signal source block 1000 contains a signal source 1002 that supplies a series of electronic components 1004–1018. The positions of each path in the bus are specifically chosen so that signal paths 1020–1090 are automatically physically aligned between the signal source block 1000 at endpoints 1110–1180, and the first adjoining Macro A 1200 at input signal interconnects 1210–1280. The bus within Macro A 1200 is laid out so that utilized signals 1282 and 1284 are tapped off from one "side" of the bus at 1310 and 1320 respectively.

The remaining signal paths to be propagated 1286–1296 are then shifted such that when they reach the outgoing opposing edge 1820 of the macro at 1330–1380, they align with the "side" of the bus from Macro B 1400 at input signal interconnects 1410–1460. This shift allows in this instance for the interconnects with "live" or untapped signals 1286–1296 to always be placed at the top of the bus at interconnects 1330–1380. The bus within Macro B 1400 is laid out so that utilized signals 1482–1486 are tapped off from one "side" of the bus, at 1510–1530 respectively. The remaining signal paths to be propagated 1488–1496 are then shifted such that when they reach the outgoing edge of the macro at 1540–1580, they reach the outgoing opposing edge 1840 and align with the "side" of the bus from a second instantiation of Macro A 1600 at input signal interconnects 1610–1680. This shift also allows for the interconnects with "live" or untapped signals 1488–1496 to be placed at the top of the bus at interconnects 1540–1580.

The bus within the second Macro A 1600 is laid out identically to the first Macro A 1200 where utilized signals 1682 and 1684 are tapped off from one "side" of the bus at 1710 and 1720 respectively. The remaining signal paths to be propagated 1686–1696 are then shifted as described in the prior instances such that when they reach the outgoing opposing edge 1860 of the macro at 1730–1780, they are able to align with the "side" of any additional Macro bus with matching input signal interconnects.

A variety of standardized interface configurations can be connected utilizing premapped contact points. To that end, communication and functionality of the circuits is realized without having to manually route signal paths through, around or over each macro instance once a macro has been created. Macro cell layouts can be customized such that the signals being used in the farther adjacent cells can be sized or boosted to compensate for losses in signal strength and increased resistance experienced with longer path distances. IC designers would then utilize this library of macros to facilitate a smaller, simpler and cheaper circuit.

The invention also promotes reuse and facilitates ease-of-use of hard macros in IC design. If the paths routed via this method have specific constraints of trace lengths, capacitance, resistance, etc., then the original macro designers and layout engineers can easily control these routes. Signals currently being routed with traces around and over macros may be routed within the modularized macro, saving path length and space. Additionally, if there are constraints for how signals can be routed through or over the macro because of signal interference, etc., the designers will have greater control over these signals. This means that engineers, who may interface with the macro in the future, require less constraint information. And, the process of making connections to these macros within an integrated circuit design is simplified. Signal paths that are designed to propagate through a macro can be bare wire paths or they can incorporate any variety of signal modifiers within the path. Modifiers such as buffers, amplifiers, cleanup circuits, etc., can be used to limit, enhance or change the signal as it is routed through the macro.

The method of this invention involves creating a "modified signal bus" path within each macro such that signals that are not internally used are propagated to an adjacent macro; however, the path of any signals that are used, are tapped off and not propagated. The modified signal bus runs from one edge of the macro to another. The positions of the endpoints of each path in the bus are specifically chosen so that signal paths are automatically aligned between macros when the macros are adjacent. The bus is laid out so that used signals are tapped off from one "side" of the bus. The remaining signal paths to be propagated are then shifted such that when they reach the outgoing edge of the macro, they align with the "side" of the bus from which the next macro will be tapping its own signals. This shift allows interconnects with "live" or untapped signals to be grouped or placed at desired locations, i.e., at the top of the bus.

Figure 2:
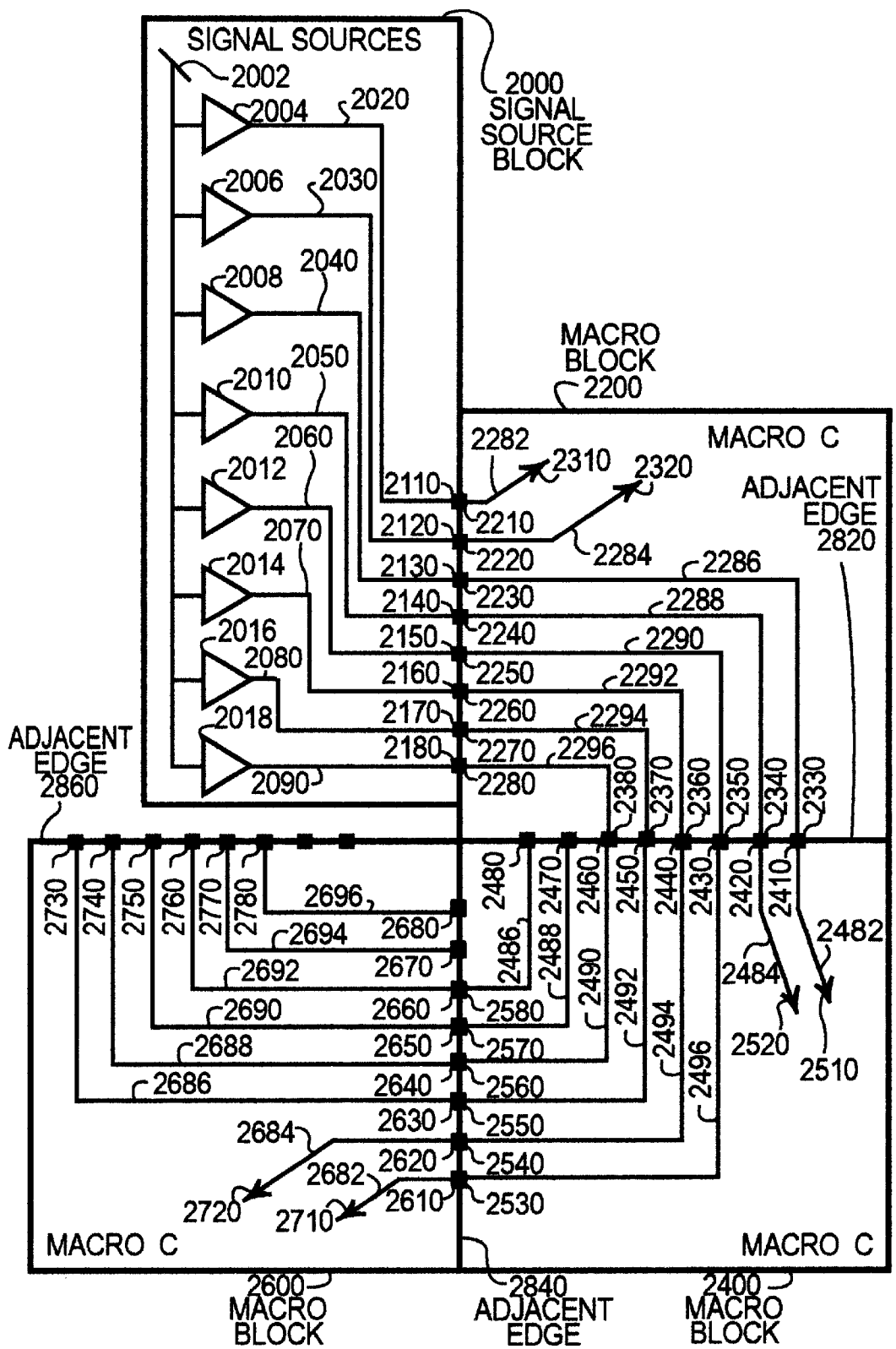
FIG. 2 is a schematic diagram of a typical macro cell layout with successive macro cells placed on an adjacent edge with respect to said input premapped interconnects of the previous macro cell.

FIG. 2 shows a top-level schematic diagram of the method of the present invention for a typical macro cell layout with successive macro cells placed on an adjacent edge with respect to said input premapped interconnects of the previous macro cell. A signal source block 2000 contains a signal source 2002 that supplies a series of electronic components 2004–2018. The positions of each path in the bus are specifically chosen so that signal paths 2020–2090 are automatically physically aligned between the signal source block 2000 at endpoints 2110–2180, and the first adjoining Macro C 2200 at input signal interconnects 2210–2280. The bus within Macro C 2200 is laid out so that utilized signals 2282 and 2284 are tapped off from one "side" of the bus at 2310 and 2320 respectively.

The remaining signal paths to be propagated 2286–2296 are then shifted such that when they reach the outgoing adjacent edge 2820 of the macro at 2330–2380, they align with the "side" of the bus from a second instantiation of Macro C 2400 at input signal interconnects 2410–2460. This shift allows for instance that the interconnects with "live" or untapped signals 2286–2296 to always be placed at the top of the bus at interconnects 2330–2380. The bus within the second instance of Macro C 2400 is laid out identically to the first instance of Macro C 2200 so that utilized signals 2482 and 2484 are tapped off from one "side" of the bus at 2510 and 2520 respectively. The remaining signal paths to be propagated 2486–2496 are then shifted such that when they reach the outgoing edge of the macro at 2530–2580, they reach the outgoing adjacent edge 2840 and align with the "side" of the bus from a third instantiation of Macro C 2600 at input signal interconnects 2610–2660. This shift also allows for the interconnects with "live" or untapped signals 2486–2496 to be placed at the top of the bus at interconnects 2530–2580.

The bus within the third Macro C 2600 is laid out identically to the first instance Macro C 2200 and the second instance Macro C 2400 where utilized signals 2682 and 2684 are tapped off from one "side" of the bus at 2710 and 2720 respectively. The remaining signal paths to be propagated 2686–2696 are then shifted as described in the prior instances such that when they reach the outgoing adjacent edge 2860 of the macro at 2730–2780, they are able to align with the "side" of any additional Macro bus with matching input signal interconnects.

Figure 3:
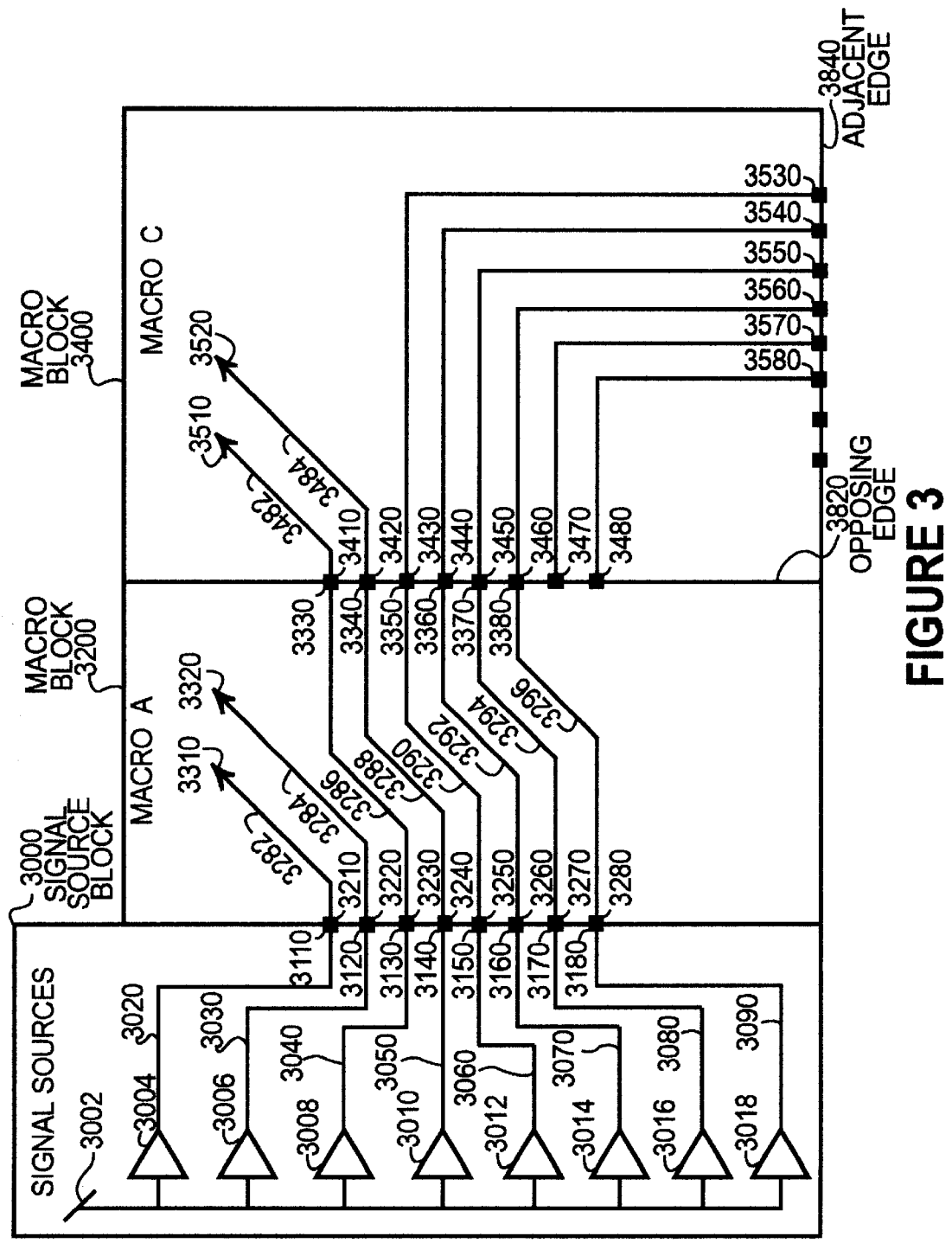
FIG. 3 is a schematic diagram of a typical macro cell layout with successive macro cells placed on a combination of opposing and adjacent edges with respect to said input premapped interconnects of the previous macro cell.

FIG. 3 shows a top-level schematic diagram of the method of the present invention for a typical macro cell layout with successive macro cells placed on a combination of opposing and adjacent edges with respect to said input premapped interconnects of the previous macro cell. A signal source block 3000 contains a signal source 3002 that supplies a series of electronic components 3004–3018. The positions of each path in the bus are specifically chosen so that signal paths 3020–3090 are automatically physically aligned between the signal source block 3000 at endpoints 3110–3180, and the first adjoining Macro A 3200 at input signal interconnects 3210–3280. The bus within Macro A 3200 is laid out so that utilized signals 3282 and 3284 are tapped off from one "side" of the bus at 3310 and 3320 respectively. The remaining signal paths to be propagated 3286–3296 are then shifted such that when they reach the outgoing opposite edge 3820 of the macro at 3330–3380, they physically align with the "side" of the bus from Macro C 3400 at input signal interconnects 3410–3460. This shift allows for instance that the interconnects with "live" or untapped signals 3286–3296 to always be placed at the top of the bus at interconnects 3330–3380. The bus within Macro C 3400 is laid out so that utilized signals 3482–3484 are tapped off from one "side" of the bus at 3510–3520 respectively. The remaining signal paths to be propagated 3486–3496 are then shifted such that when they reach the outgoing adjacent edge 3840 of the macro at 3530–3580, they are able to align with the "side" of any additional Macro bus with matching input signal interconnects.

Figure 4:
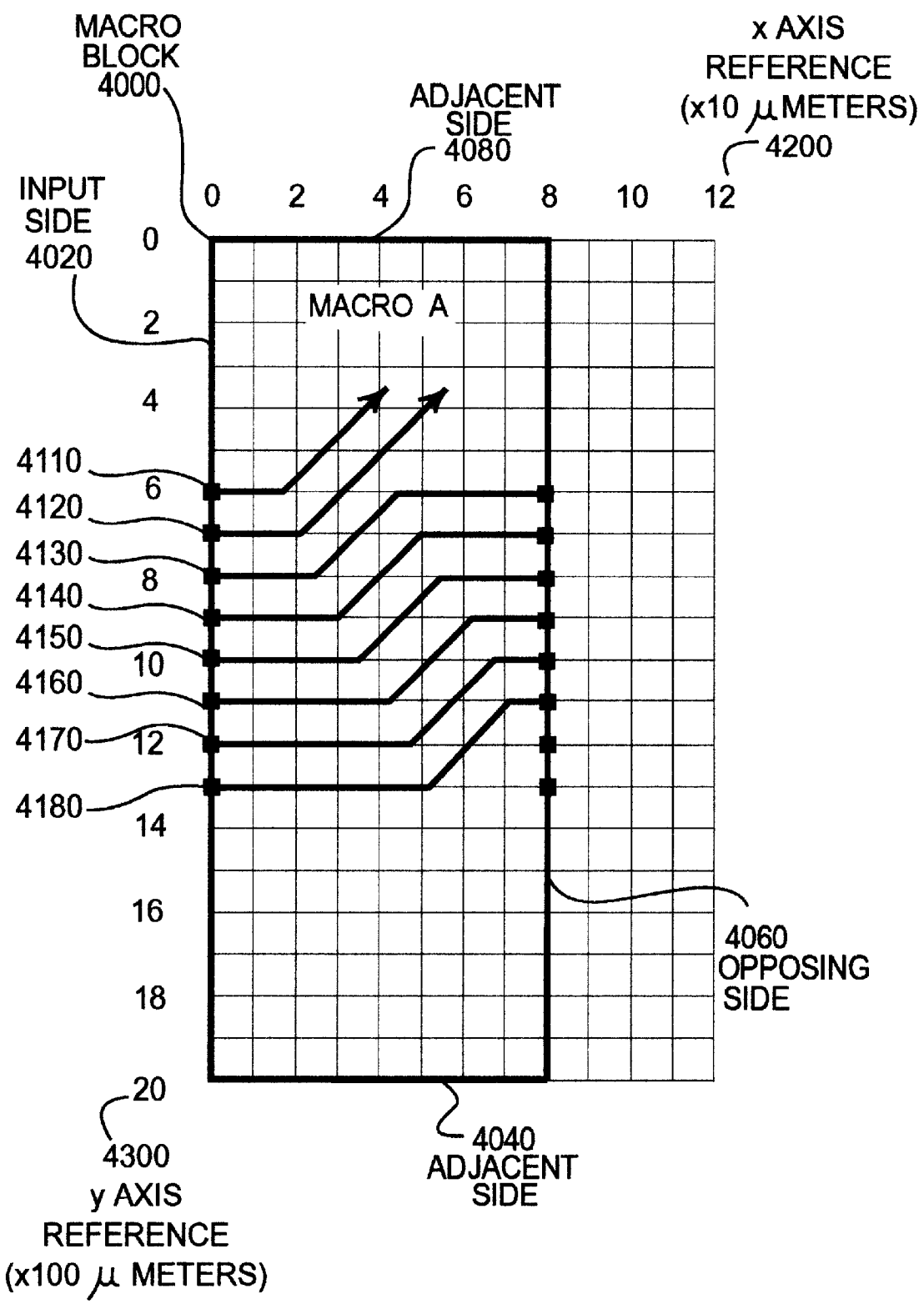
FIG. 4 is a schematic diagram of a typical macro cell layout with standardized configuration of input premapped interconnect locations; and, FIG. 5 is a schematic diagram of a typical macro cell layout with standardized configuration of output premapped interconnect locations.

FIG. 4 illustrates an integrated circuit macro cell, having an input signal interconnect layout that is premapped in a standard configuration. This standardized configuration of input interconnect locations is premapped for receiving signals from a physical alignment of output signal paths of adjoining macro edges. In this illustration Macro A 4000 contains opposing side 4060, adjacent sides 4040 and 4080, and input signal interconnects 4110–4180 on input side 4020. Each input signal interconnect 4110–4180 is located at a specific reference location with respect to an X-axis 4200 and Y-axis 4300 reference dimensions (in this illustration shown in $\mu$ meters.) For example, input signal interconnect layout places the first input signal 4110 at 0,6, the second input signal 4120 at 0,7, the third input signal 4130 at 0,8, etc. This interface would therefore accept signals, without the need for external signal paths and contain up to 8 signal paths, spaced in a linear manner 100 $\mu$ meters apart, with the initial input 600 $\mu$ meters from the top (X-axis reference point) of Macro A.

Figure 5:
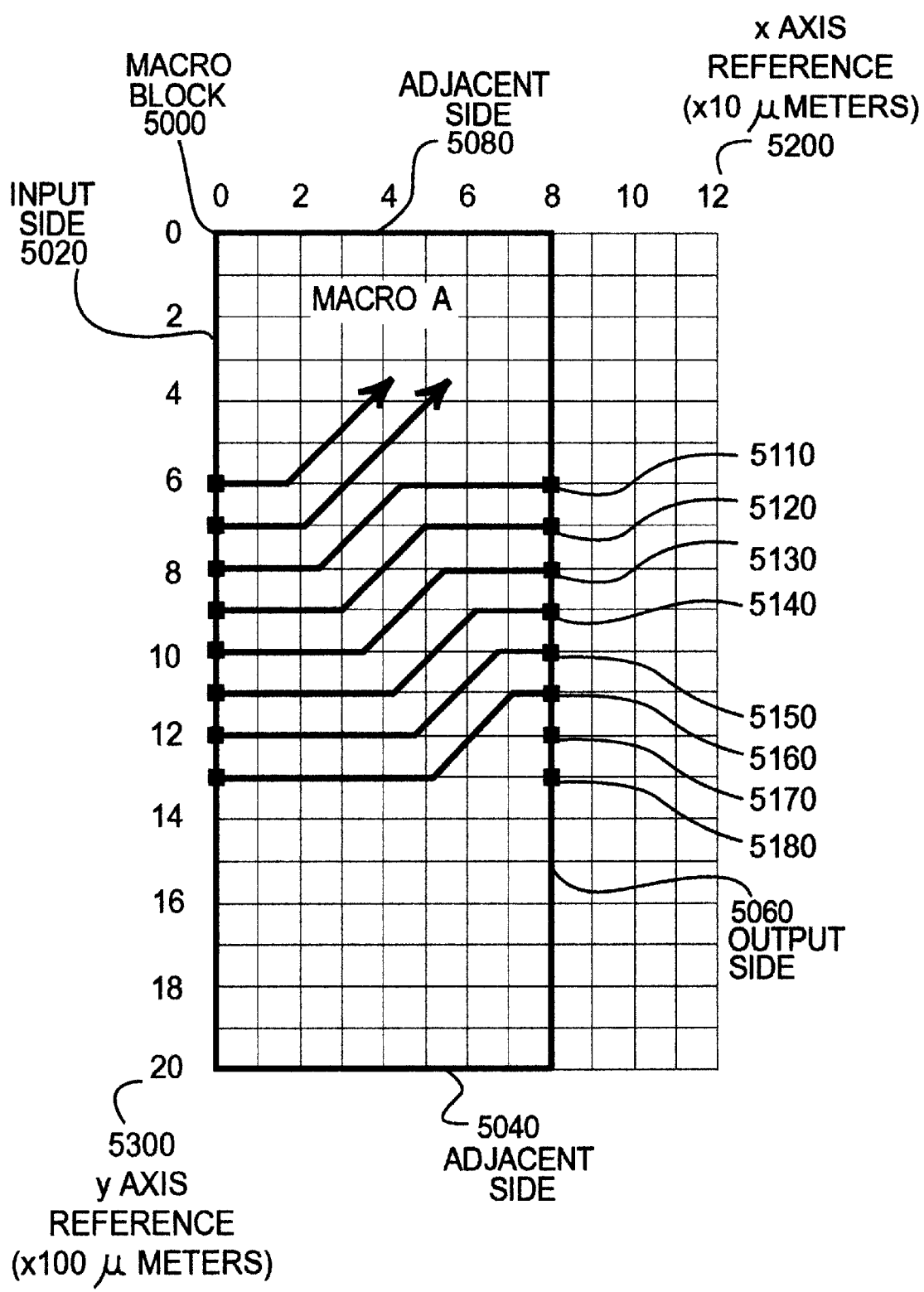

FIG. 5 illustrates an integrated circuit macro cell, having an output signal interconnect layout that is premapped in a standard configuration. This standardized configuration of output interconnect locations is premapped for transmitting signals from a physical alignment of input signal paths of adjoining macro edges. In this illustration Macro A 5000 contains input side 5020, adjacent sides 5040 and 5080, and output signal interconnects 5110–5180 on the opposing side shown as output side 5060. Each output signal interconnect 5110–5180 is located at a specific reference location with respect to an X-axis 5200 and Y-axis 5300 reference dimensions (in this illustration shown in $\mu$ meters.) For example, output signal interconnect layout places the first output signal 5110 at 8,6, the second output signal 5120 at 8,7, the third output signal 5130 at 8,8, etc. This interface would therefore transmit signals, without the need for external signal paths and contain up to 8 signal paths, spaced in a linear manner 100 $\mu$ meters apart, with the initial input 600 $\mu$ meters from the top (X-axis reference point) of Macro A Numerous variations and modifications of the embodiment described above may be effected without departing from the spirit and scope of the novel features of the invention. For example, the adjacency may comprise any variety or combination of linear and nonlinear placements. It is to be understood that no limitations with respect to the specific device illustrated herein are intended or should be inferred. It is, of course, intended to cover by the appended claims all such modifications as fall within the scope of the claims.

What is claimed is:

1. A method of routing internal signal paths from a plurality of input interconnects on a macro cell to a plurality of output interconnects on said macro cell comprising the steps of:

placing a plurality of input interconnects at premapped input interconnect positions on an input edge of said macro cell;

placing a plurality of output interconnects at premapped output interconnect positions on an output edge of said macro cell so that said output interconnects are adapted to contact input interconnects of an additional macro cell whenever premapped input interconnects of said additional macro cell are physically aligned with and connected to said premapped output interconnects of said macro cell, said premapped input interconnects of said additional macro cell located at premapped input interconnect positions that correspond to said premapped input interconnect positions of said macro cell;

routing said internal signal paths from said plurality of premapped input interconnects of said macro cell to said plurality of premapped output interconnects of said macro cell so that signals applied to each of said premapped input interconnects of said macro cell are transmitted through said macro cell to said premapped output interconnects of said macro cell that are adapted to connect to said input interconnects of said additional macro cell that are located in positions that are different from said premapped input interconnects of said macro cell.

2. A method of claim 1 further comprising the step of:
terminating at least one said internal signal path within said macro cell.

3. A method of routing internal signal paths from a plurality of input interconnects on a macro cell to a plurality of output interconnects on said macro cell comprising the steps of:

placing a plurality of input interconnects at premapped input interconnect positions on an input edge of said macro cell;

placing a plurality of output interconnects at premapped output interconnect positions on an output edge of said macro cell so that said output interconnects are adapted to contact corresponding premapped input interconnects of an additional macro cell whenever premapped input interconnects of said additional macro cell are physically aligned with and connected to said premapped output interconnects of said macro cell, said corresponding premapped input interconnects of said additional macro cell located at premapped input interconnect positions that correspond to said premapped input interconnect positions of said macro cell;

routing said internal signal paths from a first set of premapped input interconnects of said plurality of premapped input interconnects of said macro cell to said plurality of premapped output interconnects of said macro cell so that said signal paths are shifted to distribute signals to a set of corresponding input interconnects of said additional macro cell that are different from said first set of premapped input interconnects of said macro cell.

4. A method of claim 3 further comprising the step of:
terminating at least one said internal signal path within said macro cell.

5. A method of routing internal signal paths from a plurality of input interconnects on a macro cell to a plurality of output interconnects on said macro cell comprising the steps of:

placing a plurality of input interconnects at premapped input interconnect positions on an input edge of said macro cell that creates a position pattern of input interconnects having an input signal pattern;

placing a plurality of output interconnects at premapped output interconnect positions that creates a position pattern of output interconnects on an output edge of said macro cell that corresponds to said position pattern of input interconnects and so that said output interconnects are adapted to contact additional premapped input interconnects of an additional macro cell whenever said premapped input interconnects of said additional macro cell are physically aligned with and connected to said premapped output interconnects of said macro cell, said additional input interconnects having an additional position pattern that corresponds to said output position pattern of said macro cell;

routing said internal signal paths from said plurality of premapped input interconnects of said macro cell to said plurality of premapped output interconnects of said macro cell that creates an output signal pattern that does not correspond to said input signal pattern.

6. A method of claim 5 further comprising the step of:
terminating at least one said internal signal path within said macro cell.

7. A method of minimizing external signal paths between integrated circuit macro cells by routing internal signal paths from a plurality of first input interconnects to a plurality of output interconnects on a first macro cell to facilitate an abutment connection to a plurality of second input interconnects on a second macro cell comprising the steps of:

placing said first macro cell comprising a plurality of said first input interconnects at premapped input interconnect positions on a first input edge of said first macro cell that creates a first position pattern of input interconnects having a first input signal pattern, a plurality of output interconnects at premapped output interconnect positions that create a position pattern of output interconnects on an output edge of said first macro cell such that said position pattern of output interconnects corresponds to said first position pattern of input interconnects and so that said output interconnects are adapted to contact said plurality of second input interconnects on said second macro cell;

routing said internal signal paths from said plurality of first premapped input interconnects of said first macro cell to said plurality of premapped output interconnects of said first macro cell that creates an output signal pattern that does not correspond to said first input signal pattern;

placing said second macro that has a second position pattern of input interconnects in contact with said first macro cell and such that said plurality of second input interconnects on said second macro cell are physically aligned with and connected to said premapped output interconnects of said first macro cell and said second position pattern of input interconnects of said second macro cell correspond to said output position pattern of said first macro cell.

8. A method of claim 7 further comprising the step of:
terminating at least one said internal signal path within said first macro cell.

9. A method of claim 7 further comprising the step of:
distributing a plurality of unique signals from said first output interconnects of said first macro cell to said second input interconnects of said second macro cell.

10. The method of claim 7 further comprising the step of:
placing said output edge of said first macro cell on an opposing edge with respect to said first input edge of said first macro cell.

11. The method of claim 7 further comprising the step of:
placing said output edge of said first macro cell on an adjacent edge with respect to said first input edge of said first macro cell.

12. A method of minimizing external signal paths between integrated circuit macro cells by routing internal signal paths from a plurality of first input interconnects to a plurality of output interconnects on a first macro cell to facilitate an abutment connection to a corresponding plurality of second input interconnects on a second macro cell having the steps of:

placing said first macro cell having said plurality of first input interconnects at premapped first input interconnect positions on a first input edge of said macro cell and said plurality of output interconnects at premapped output interconnect positions on an output edge of said macro cell so that said output interconnects are adapted to contact said corresponding plurality second input interconnects of said second macro cell whenever said corresponding premapped second input interconnects of said second macro cell are physically aligned with and connected to said premapped output interconnects of said first macro cell;

routing said internal signal paths from said set of premapped first input interconnects of said plurality of premapped first input interconnects of said first macro cell to said plurality of premapped output interconnects of said first macro cell so that said signal paths are shifted to distribute signals to said corresponding set of second premapped input interconnects of said second macro cell that are different from said first set of premapped input interconnects of said first macro cell;

placing said second macro cell in contact with said first macro cell such that said plurality of second input interconnects are disposed at premapped second input interconnect positions that correspond to said premapped first input interconnect positions of said first macro cell and are physically aligned with and connected to said premapped output interconnects of said first macro cell.

13. A method of claim 12 further comprising the step of: terminating at least one said internal signal path within said first macro cell.

14. A method of claim 12 further comprising the step of: distributing a plurality of unique signals from said first output interconnects of said first macro cell to said second input interconnects of said second macro cell.

15. The method of claim 12 further comprising the step of: placing said output edge of said first macro cell on an opposing edge with respect to said first input edge of said first macro cell.

16. The method of claim 12 further comprising the step of: placing said output edge of said first macro cell on an adjacent edge with respect to said first input edge of said first macro cell.

17. An integrated circuit macro cell that minimizes the need for external signal paths when said macro cell is connected by abutment to additional macro cells comprising:

a plurality of input interconnects placed at premapped input interconnect locations on an input edge of said macro cell;

a plurality of output interconnects placed at premapped output interconnect locations on an output edge of said macro cell so that said output interconnects are adapted to contact corresponding premapped input interconnects of an additional macro cell whenever said premapped input interconnects of said additional macro cell are physically aligned with and connected to said premapped output interconnects of said macro cell;

a plurality of internal signal paths within said macro cell that are shifted to create a distribution of signals from said plurality of premapped output interconnects that are different from said plurality of premapped input interconnects of said macro cell, said corresponding premapped input interconnects of said additional macro cell located at premapped input interconnect locations that correspond to said premapped output interconnect locations of said macro cell.

18. An integrated circuit macro cell method of claim 17 wherein at least one of said internal signal paths of said plurality of internal signal paths is terminated within said macro cell.

19. An integrated circuit macro cell that minimizes the need for external signal paths when said macro cell is connected by abutment to additional macro cells comprising:

a plurality of first input interconnects placed at premapped first input interconnect locations on a first input edge of said first macro cell that creates a position pattern of input interconnects having an input signal pattern;

a plurality of output interconnects at premapped output interconnect positions that create a position pattern of output interconnects on an output edge of said macro cell that corresponds to said position pattern of input interconnects and so that said output interconnects are adapted to contact additional premapped input interconnects of said additional macro cell whenever said premapped input interconnects of said additional macro cell are physically aligned with and connected to said premapped output interconnects of said macro cell, said additional input interconnects having an additional position pattern that corresponds to said output position pattern of said macro cell;

a plurality of internal signal paths routed from said plurality of premapped input interconnects of said macro cell to said plurality of premapped output interconnects of said macro cell that creates an output signal pattern that does not correspond to said input signal pattern.

20. An integrated circuit macro cell method of claim 18 wherein at least one of said internal signal paths of said plurality of internal signal paths is terminated within said macro cell.

21. An integrated circuit that minimizes the need for external signal paths when macro cells are connected by abutment comprising:

a first macro cell comprising;

a plurality of first input interconnects at premapped input interconnect positions on a first input edge of said first macro cell that creates a first position pattern of input interconnects having a first input signal pattern;

a plurality of output interconnects at premapped output interconnect positions that create a position pattern of output interconnects on an output edge of said first macro cell such that said position pattern of output interconnects corresponds to said first position pattern of input interconnects and so that said output interconnects are adapted to contact a plurality of second input interconnects on a second macro cell;

a plurality of internal signal paths routed from said plurality of first premapped input interconnects of said first macro cell to said plurality of premapped output interconnects of said first macro cell that creates an output signal pattern that does not correspond to said first input signal pattern;

said second macro cell in contact with said first macro cell comprising;

said plurality of second input interconnects in a second position pattern of input interconnects in contact with said first macro cell such that said plurality of second input interconnects on said second macro cell are physically aligned with and connected to said premapped output interconnects of said first macro cell;

said second position pattern of input interconnects of said second macro cell being disposed on said second macro cell to physically correspond to said output position pattern of said first macro cell.

22. An integrated circuit macro cell method of claim 21 wherein at least one of said internal signal paths of said plurality of internal signal paths is terminated within said macro cell.

23. An integrated circuit that minimizes the need for external signal paths when macro cells are connected by abutment comprising:

a first macro cell comprising;

a plurality of first input interconnects at premapped first input interconnect positions on a first input edge of said macro cell;

a plurality of output interconnects at premapped output interconnect positions on an output edge of said macro cell so that said output interconnects are adapted to contact corresponding premapped second input interconnects of a second macro cell whenever said premapped second input interconnects of said second macro cell are physically aligned with and connected to said premapped output interconnects of said first macro cell;

a plurality of internal signal paths routed from said plurality of premapped first input interconnects of said first macro cell to said plurality of premapped output interconnects of said first macro cell, said signal paths that are shifted to distribute signals from said plurality of premapped first input interconnects that are different from said plurality of premapped output interconnects of said first macro cell;

said second macro cell in contact with said first macro cell comprising;

said plurality of second input interconnects disposed at premapped second input interconnect positions that correspond to said premapped first input interconnect positions of said first macro cell;

said plurality of second premapped input interconnects further placed such that said plurality of second input interconnects on said second macro cell are physically aligned with and connected to said plurality of premapped output interconnects of said first macro cell.

24. An integrated circuit of claim 23 wherein at least one of said internal signal paths from said first plurality of input interconnects is terminated within said macro cell.

25. An integrated circuit of claim 23 wherein said first output edge of said first macro cell is on an opposing edge with respect to said first input edge of said first macro cell.

26. An integrated circuit of claim 23 wherein said first output edge of said first marco cell is on an adjacent edge with respect to said first input edge of said first macro cell.

27. An integrated circuit of claim 23 wherein said first macro cell said second macro cell are selected from a library of standardized input and output premapped interconnect configurations.

* * * * *